(12) United States Patent
Yang et al.

(10) Patent No.: US 7,786,527 B2
(45) Date of Patent: Aug. 31, 2010

(54) SUB-LITHOGRAPHIC GATE LENGTH TRANSISTOR USING SELF-ASSEMBLING POLYMERS

(75) Inventors: Haining S. Yang, Wappingers Falls, NY (US); Wai-Kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 206 days.

(21) Appl. No.: 12/099,435

(22) Filed: Apr. 8, 2008

(65) Prior Publication Data
US 2008/0179667 A1 Jul. 31, 2008

Related U.S. Application Data

(62) Division of application No. 11/552,641, filed on Oct. 25, 2006, now Pat. No. 7,384,852.

(51) Int. Cl.
*H01L 29/76* (2006.01)
(52) U.S. Cl. .................. 257/327; 257/330; 257/351; 257/E29.255; 257/E21.206; 438/299
(58) Field of Classification Search .............. 257/327, 257/330, 351, E29.255, E21.206; 438/299
See application file for complete search history.

(56) References Cited

U.S. PATENT DOCUMENTS

| 6,353,249 | B1 | 3/2002 | Boyd et al. |
| 6,706,402 | B2 | 3/2004 | Ruekes et al. |
| 6,806,534 | B2 | 10/2004 | Dokumaci et al. |
| 7,045,851 | B2 | 5/2006 | Black et al. |
| 2002/0028555 | A1 | 3/2002 | Boyd et al. |
| 2002/0031891 | A1* | 3/2002 | Kim .................... 438/304 |
| 2002/0170021 | A1* | 11/2002 | Houge et al. ............ 716/4 |
| 2004/0135212 | A1 | 7/2004 | Dokumaci et al. |
| 2005/0221019 | A1* | 10/2005 | Baik et al. ............... 427/487 |
| 2005/0242303 | A1* | 11/2005 | Platzgummer ....... 250/492.22 |
| 2007/0077519 | A1* | 4/2007 | Tarutani ................ 430/270.1 |
| 2007/0293041 | A1 | 12/2007 | Yang et al. |

FOREIGN PATENT DOCUMENTS

| CN | 1226741 A | 8/1999 |
| CN | 1779903 A | 10/2005 |
| CN | 1799131 A | 7/2006 |

OTHER PUBLICATIONS

Nealey et al., Self-Asse3. Nealey et al., "Self-Assembling Resists for Nanolithography", IEEE, 2005, 4 pages.

(Continued)

*Primary Examiner*—Tu-Tu V Ho
(74) *Attorney, Agent, or Firm*—Scully, Scott, Murphy & Presser, P.C.; Katherine S. Brown, Esq.

(57) ABSTRACT

A semiconductor structure including at least one transistor located on a surface of a semiconductor substrate, wherein the at least one transistor has a sub-lithographic channel length, is provided. Also provided is a method to form such a semiconductor structure using self-assembling block copolymer that can be placed at a specific location using a pre-fabricated hard mask pattern.

12 Claims, 5 Drawing Sheets

OTHER PUBLICATIONS

Singh et al., "Effect of Top Coat and Resist Thickness on Line Edge Roughness", Proc. of SPIE, 2006, 61530W-1 to 61530W-12, vol. 6153, 12 pages.

IBM Technical Disclosure Bulletin, "Self-Assembled Monolayers As High-Resolution Resists", vol. 39, No. 04, Apr. 1996.

IBM Technical Disclosure Bulletin, "Fabrication of Gold Nonostructures by Lithography With Self-Assembled Monolayers", Biebuyck et al., vol. 39, No. 12, Dec. 1996.

Black et al., "Integration of Self Assembly for Semiconductor Microelectronics", IEEE (2005) pp. 87-91.

Black et al., "Nonometer -Scale Pattern Registration and Alignment By Directed Diblock Copolymer Self-Assembly", IEEE vol. 3, No. 3, Sep. 2004.

* cited by examiner

SUB-LITHOGRAPHIC GATE LENGTH TRANSISTOR USING SELF-ASSEMBLING POLYMERS

The present application is a divisional of copending U.S. patent application Ser. No. 11/520,641, filed on Oct. 25, 2006.

FIELD OF THE INVENTION

The present invention relates to semiconductor device manufacturing, and more particularly to a method of forming a transistor having a sub-lithographic gate length using self-assembling copolymers. The present invention also relates to a semiconductor structure including at least one transistor having a sub-lithographic gate length.

BACKGROUND OF THE INVENTION

Over the past twenty-five years or so, the primary challenge of very large scale integration (VLSI) has been the integration of an ever-increasing number of metal oxide semiconductor field effect transistor (MOSFET) devices with high yield and reliability. This was achieved mainly in the prior art by scaling down the MOSFET channel length without excessive short-channel effects. As is known to those skilled in the art, short-channel effects are the decrease in threshold voltage Vt in short-channel devices due to two-dimensional electrostatic charge sharing between the gate and the source/drain diffusions.

As the 45 nm node and the 32 nm node generations of complementary metal-oxide-semiconductor (CMOS) devices are approached, scaling of a transistor's gate length becomes imperative. However, the scaling effort is significantly limited by conventional lithographic printing, which has been used for patterning the gates of such transistors. The current 0.93 NA (numerical aperture) lithographic tool used in patterning the gates can only resolve 90 nm line width. Future 1.2 NA immersion lithographic tools are expected to print 70 nm line widths. As such, there is a need to reduce the gate length of transistors below 60, preferably below 50, nm.

Moreover, the line edge roughness and critical dimension variation of conventional lithography results in more significant Vt variation due to smaller feature size.

In view of the above, there is a need to provide a method of scaling semiconductor transistors to have sub-lithographic (less than 60, preferably less than about 50, nm) gate lengths.

SUMMARY OF THE INVENTION

The present invention provides a semiconductor structure having at least one transistor located on a surface of a semiconductor substrate, wherein the at least one transistor has a sub-lithographic channel length. The present invention also provides a method to form such a semiconductor structure using a self-assembling block copolymer that can be placed at a specific location using a pre-fabricated hard mask pattern. The inventive method provides a semiconductor structure that has sub-lithographic channel lengths. It is noted that the term "sub-lithographic" is used throughout the instant application to denote dimensions, including channel lengths, below 60 nm.

In one aspect of the present invention, a semiconductor structure is provided that comprises:

at least one transistor located on a surface of a semiconductor substrate, said at least one transistor having a gate length of less than 60 nm and a line edge roughness in terms of 3-sigma of less than 6 nm.

Line edge roughness (LER) from conventional lithography illumination and photoresist processing leads to device parameter fluctuation and device mismatch, resulting in reduced process window and product performance degradation. As device dimension scales, the impact of roughness increases. LER can be measured statistically using a variability parameter called variance or 'sigma'. The 3-sigma of conventional patterned gate stacks is greater than 6 nm.

In an embodiment of the present invention, the at least one transistor is a p-type field effect transistor (pFET). In another embodiment of the present invention, the at least one transistor is an n-type field effect transistor (nFET). In yet another embodiment of the present invention, the structure includes at least one pFET and a least one nFET, wherein both types of transistors have sub-lithographic channel lengths.

In another aspect of the present invention, a method of fabricating a semiconductor structure including at least one transistor having a sub-lithographic channel length located on a surface of a semiconductor substrate is provided. The method of the present invention combines conventional lithographic technology and a copolymer self-assembling technique to place one polymer unit with precise position. The polymer is self-aligned to the pre-defined lithographically defined pattern boundaries. The single polymer can then be selectively removed and the remaining polymer is used as a photo mask to pattern a transistor gate. The final feature size is determined by the polymer molecule rather than conventional lithography. Because conventional lithography is not used in providing the final gate transistor, defects such as line edge roughness and CD variation are avoided.

In general terms, the method of the present invention comprises:

providing a structure including a patterned hard mask located above a sacrificial layer and a semiconductor substrate, wherein said patterned hard mask includes at least one lithographically defined opening exposing a surface of said sacrificial layer;

providing a block copolymer having a single unit polymer block with a sub-lithographic width inside the at least one lithographically defined opening, wherein the single unit polymer block comprises a second polymeric block component which is embedded in a polymeric matrix that comprises a first polymeric block component of said block copolymer;

selectively removing the second polymeric block component relative to the first polymeric block component to form a sub-lithographic opening in the polymeric matrix inside the at least one lithographically defined opening;

transferring said sub-lithographic opening to said sacrificial layer;

removing the block copolymer and the patterned hard mask;

forming a gate dielectric and a gate conductor within said at least one lithographical defined opening; and removing the sacrificial layer.

The block copolymers as mentioned hereinabove preferably comprise A:B block copolymers wherein A is a first polymeric component and B is a second polymeric component having a weight ratio of A:B from about 20:80 to about 80:20, and the single unit polymer block preferably comprises a cylinder that stands vertical to an upper surface of the semiconductor substrate. The block copolymers can be readily selected from the group consisting of polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). In a particularly preferred, but not necessary, embodiment of the present invention, the block copolymers comprise PS-b-PMMA having a PS:PMMA weight ratio ranging from about 20:80 to about 80:20.

Other aspects, features and advantages of the invention will be more fully apparent from the ensuing disclosure and appended claims.

DETAILED DESCRIPTION OF THE INVENTION

The present invention, which provides a semiconductor structure including at least one transistor having a sub lithographic gate length and a method of fabricating the same, will now be described in greater detail by referring to the following description and drawings that accompany the present application. It is noted that the drawings of the present invention are provided for illustrative purposes and, as such, they are not drawn to scale. In each of the drawings, drawing A is a top-down view and drawing B is a cross sectional view through line A-A.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, a semiconductor structure having at least one transistor located on a surface of a semiconductor substrate, wherein the at least one transistor has a sub-lithographic channel length, is provided. The present invention also provides a method to form such a semiconductor structure using a self-assembling block copolymer that can be placed at a specific location using a pre-fabricated hard mask pattern. The inventive method provides a semiconductor structure that has sub-lithographic channel lengths (e.g., gate lengths less than 60 nm) and a line edge roughness that is smoother than that obtained by conventional processing.

Reference is now made to the various drawings which illustrate the basic processing steps that are used in the present invention for forming a semiconductor structure including sub-lithographic gate transistors. The processing of the present invention combines conventional lithographic technology and a copolymer self-assembling technique to place one polymer unit with precise position. The polymer is self-aligned to the pre-defined lithographically defined pattern boundaries. The single polymer can then be selectively removed and the remaining polymer is used as a photo mask to pattern a transistor gate. The final feature size is determined by the polymer molecule rather than conventional lithography. Because conventional lithography is not used in providing the final gate transistor, defects such as line edge roughness and CD variation are avoided.

Figure 1A:
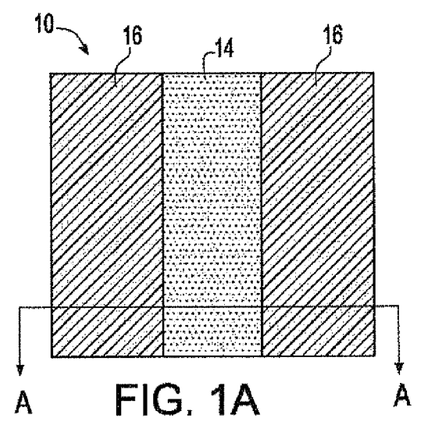
FIGS. 1A-1B are pictorial representations (through a top-down and a cross sectional view) of a structure which includes a patterned hard mask having at least one lithographically defined opening located atop a sacrificial layer and a semiconductor substrate.
Figure 1B:
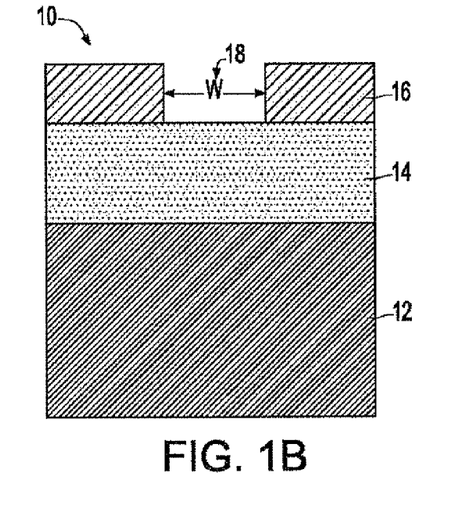

Reference is made to FIGS. 1A-1B which illustrate an initial structure 10 that is employed in the present invention for fabricating the sub-lithographic gate transistors. As is shown, the initial structure 10 includes a semiconductor substrate 12, a sacrificial layer 14 located on a surface of the semiconductor substrate 12, and a patterned hard mask 16 having at least one lithographically defined mask opening 18 located on a surface of the sacrificial layer 14. The at least one lithographically defined mask opening 18 exposes portions of the underlying sacrificial layer 14.

The structure 10 shown in FIGS. 1A-1B is formed utilizing conventional materials and techniques that are well known to those skilled in the art. For example, the semiconductor substrate 12 is first provided. The semiconductor substrate 12 comprises any semiconducting material including, for example, Si, SiGe, SiGeC, SiC, Ge alloys, GaAs, InAs, InP, as well as other III-V or II-VI compound semiconductors. The semiconductor substrate 12 may also comprise a layered semiconductor such as Si/SiGe, or a semiconductor-on-insulator (SOI). Preferably, the semiconductor substrate 12 is composed of a Si-containing semiconductor material, i.e., a semiconductor material that includes Si. The semiconductor substrate 12 may be doped, undoped or contain both doped and undoped regions therein.

The semiconductor substrate may have a single crystal orientation or hybrid substrates including regions of different crystal orientations may be employed. When hybrid substrates are employed, the regions of different crystal orientations may be co-planar with each other. Hybrid semiconductor structures provide the ability to form the transistor on a surface orientation that provides optimal carrier mobility. For example, and when Si is employed, electron mobility is higher on a {100} surface orientation, while hole mobility is higher on a {110} surface orientation. In such a case, the {100} Si surface is used as the device layer for forming nFETs, while the {110} Si surface is used as the device layer for forming pFETs. Formation of such hybrid substrates is well known to those skilled in the art and, as such, no details regarding their formation is provided herein.

In some embodiments of the present invention, at least one isolation region, such as, for example, a trench isolation or a field oxide isolation region, is formed in the semiconductor substrate 12 to isolate different device regions from each other. Trench isolation regions are formed utilizing a conventional trench isolation process that is well known to those skilled in the art. For example, lithography, etching and filling of the trench with a trench dielectric such as an oxide may be used in forming the same. Optionally, a liner may be formed in the trench prior to trench fill, a densification step may be performed after the trench fill and a planarization process may follow the trench fill as well. Field oxide isolation regions are formed utilizing a so-called local oxidation of silicon process.

After providing the semiconductor substrate 12, a sacrificial layer 14 is formed on the surface of the substrate 12. The sacrificial layer 14 typically comprises an oxide such as, for example, silicon oxide, or silicon oxynitride. The sacrificial layer 14 is formed utilizing a conventional deposition process including, for example, chemical vapor deposition (CVD), plasma enhanced chemical vapor deposition (PECVD), evaporation, chemical solution deposition, and atomic layer deposition (ALD). Alternatively, thermal oxidation may be used to form the sacrificial layer 14. The sacrificial layer 14 may also be formed utilizing a combination of any of the aforementioned processes.

The thickness of the as deposited sacrificial layer 14 may vary depending on, for example, the technique used in forming the same.

Following the formation of the sacrificial layer 14, a hard mask layer is formed on the surface of the sacrificial layer 14. The hard mask layer typically comprises a nitride, such as, for example, silicon nitride. The hard mask layer is formed utilizing a conventional deposition process and/or thermal nitrification. The thickness of the hard mask layer may vary depending on the technique used in forming the same. Typically, the hard mask layer has a thickness from about 20 to about 60 nm, with a thickness from about 30 to about 50 nm being even more typical.

After forming the hard mask layer on the surface of the sacrificial layer, the hard mask layer is patterned to form patterned hard mask 16 which has at least one lithographically defined mask opening 18 therein. The patterned hard mask 16 is formed by applying a photoresist (not shown) to the hard mask layer, exposing the photoresist to a pattern of radiation, developing the exposed resist material to provide a patterned resist atop of the hard mask layer, and thereafter transferring the pattern into the hard mask layer by etching. A dry etching process (including reactive ion etching, ion beam etching and plasma etching) or a wet chemical etching process may be used to pattern the hard mask layer.

The width (W) of the lithographically defined mask opening 18 in patterned hard mask 16 is limited by the minimum printing critical dimension (CD) of conventional lithography and cannot be further reduced using the conventional lithographic techniques alone. Typically, the width W is about 80 nm or greater. The present invention therefore employs self-assembling block copolymers to form sub-lithographic patterns in the lithographically defined mask opening 18.

It has been known that certain materials are capable of spontaneous organization of materials into ordered patterns without the need for human interference, which is typically referred to as the self-assembly of materials. Examples of material self-assembly range from snowflakes to seashells to sand dunes, all of which form some type of regular or ordered patterns in response to the external conditions.

Among various self-assembling materials, self-assembling block copolymers that are capable of self-organizing into nanometer-scale patterns are particularly promising for enabling future advances in the semiconductor technology. Each self-assembling block copolymer system typically contains two or more different polymeric block components that are immiscible with one another. Under suitable conditions, the two or more immiscible polymeric block components separate into two or more different phases on a nanometer scale and thereby form ordered patterns of isolated nano-sized structural units.

Such ordered patterns of isolated nano-sized structural units formed by the self-assembling block copolymers can be used for fabricating nano-scale structural units in semiconductor, optical, and magnetic devices. Specifically, dimensions of the structural units so formed are typically in the range of 10 to 40 nm, which are sub-lithographic (i.e., below the resolutions of the lithographic tools). Further, the self-assembling block copolymers are compatible with conventional semiconductor, optical and magnetic processes. Therefore, the ordered patterns of nano-sized structural units formed by such block copolymers have been integrated into semiconductor, optical, and magnetic devices where a large, ordered array of repeating structural units are required.

However, the CMOS technology requires precise placement or registration of individual structural units for formation of semiconductor devices. Therefore, the large, ordered array of repeating structural units formed by self-assembling block copolymers could not be used in CMOS devices, because of lack of alignment or registration of the position of individual structure unit.

The present invention provides a method that combines a conventional lithographic technology with the self-assembling block copolymer technology to form sub-lithographic patterns within the lithographically defined mask opening 18.

Specifically, a thin layer of a self-assembling block copolymer (having a thickness typically ranging from about 20 nm to about 100 nm) is first applied over the structure shown in FIGS. 1A-1B and then annealed to form an ordered pattern containing repeating structural units inside the already formed lithographically defined mask opening 18.

Figure 2A:
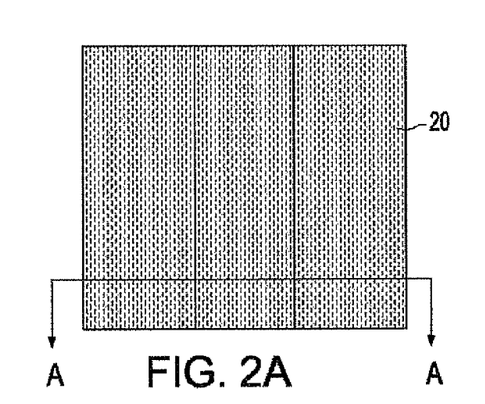
FIGS. 2A-2B are pictorial representations (through a top-down and a cross sectional view) of the structure of FIGS. 1A-1B after applying a self-assembling copolymer thereto.
Figure 2B:
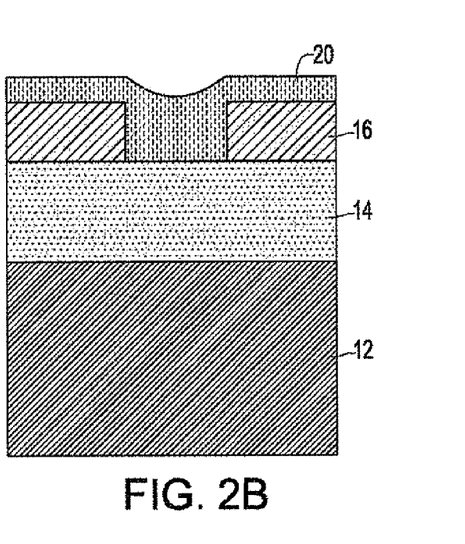
Figure 3A:
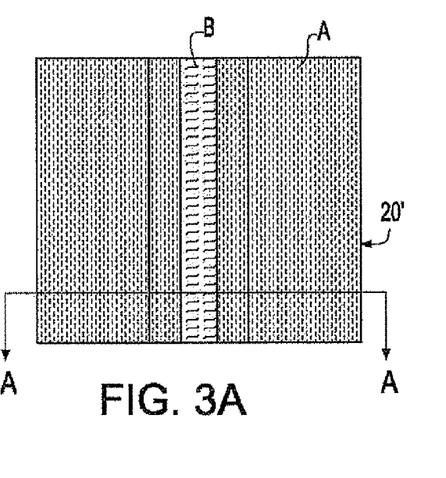
FIGS. 3A-3B are pictorial representations (through a top-down and a cross sectional view) of the structure of FIGS. 2A-2B after annealing the self-assembling copolymer.
Figure 3B:
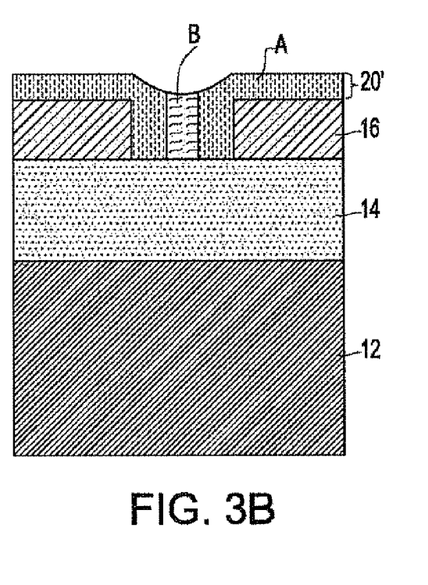

FIGS. 2A-2B show the structure after applying the thin self-assembly block copolymer 20 to the structure shown in FIGS. 1A-1B, while FIGS. 3A-3B show the structure after annealing which forms an annealed block copolymer 20'.

It is noted that the width (W) of the lithographically defined mask opening 18 is carefully adjusted so that only a single unit polymer block can be formed therein from the self-assembling block copolymer. The single unit polymer block is embedded in a polymeric matrix that is in turn located inside the lithographically defined mask opening 18, and it has a width that is less than the diameter of the lithographically defined mask opening 18. The single unit polymer block can be selectively removed relative to the polymeric matrix, thereby leaving a single opening of the smaller width in the polymeric matrix inside the lithographically defined mask opening 18'. The single opening of the smaller width can then be used for sub-lithographic gate transistors.

There are many different types of block copolymers that can be used for practicing the present invention. As long as a block copolymer contains two or more different polymeric block components that are not immiscible with one another, such two or more different polymeric block components are capable of separating into two or more different phases on a nanometer scale and thereby form patterns of isolated nano-sized structural units under suitable conditions.

In a preferred, but not necessary, embodiment of the present invention, the block copolymer consists essentially of a first polymeric component (A) and a second polymeric block component (B) that are immiscible with each other. The block copolymer may contain any numbers of the polymeric block components A and B arranged in any manner. The block copolymer can have either a linear or a branched structure. Preferably, such a block polymer is a linear diblock copolymer having the formula of A-B.

Specific examples of suitable block copolymers that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The specific structural units formed by the block copolymer are determined by the molecular weight ratio between the first and second polymeric block components A and B. For example, when the ratio of the molecular weight of the first polymeric block component A over the molecular weight of the second polymeric block component B is greater than about 80:20, the block copolymer will form an ordered array of spheres composed of the second polymeric block component B in a matrix composed of the first polymeric block component A. When the ratio of the molecular weight of the first polymeric block component A over the molecular weight of the second polymeric block component B is less than about 80:20 but greater than about 60:40, the block copolymer will form an ordered array of cylinders composed of the second polymeric block component B in a matrix composed of the first polymeric block component A. When the ratio of the molecular weight of the first polymeric block component A over the molecular weight of the second polymeric block component B is less than about 60:40 but is greater than about 40:60, the block copolymer will form alternating lamellae composed of the first and second polymeric block components A and B. Therefore, the molecular weight ratio between the first and second polymeric block components A and B can be readily adjusted in the block copolymer of the present invention, in order to form desired structural units.

In a preferred embodiment of the present invention, the ratio of the molecular weight of the first polymeric block component A over the molecular weight of the second polymeric block component B ranges from about 60:40 to about 80:20, so that the block copolymer of the present invention will form alternating layers of the first polymeric block component A and the second polymeric block component B.

Preferably, one of the components A and B can be selectively removable relative to the other, thereby resulting in either orderly arranged structural units composed of the unremoved component. For example, when the second polymeric block component B is selectively removable relative to the first polymeric block component A, orderly arranged trenches can be formed.

In a particularly preferred embodiment of the present invention, the block copolymer used for forming the self-assembled periodic patterns of the present invention is PS-b-PMMA with a PS:PMMA molecular weight ratio ranging from about 20:80 to about 80:20.

Typically, mutual repulsion between different polymeric block components in a block copolymer is characterized by the term $\chi N$, where $\chi$ is the Flory-Huggins interaction parameter and N is the degree of polymerization. The higher $\chi N$, the higher the repulsion between the different blocks in the block copolymer, and the more likely the phase separation therebetween. When $\chi N > 10$ (which is hereinafter referred to as the strong segregation limit), there is a strong tendency for the phase separation to occur between different blocks in the block copolymer.

For a PS-b-PMMA diblock copolymer, $\chi$ can be calculated as approximately $0.028+3.9/T$, where T is the absolute temperature. Therefore, $\chi$ is approximately 0.0362 at 473K ($\approx 200°$ C.). When the molecular weight ($M_n$) of the PS-b-PMMA diblock copolymer is approximately 64 Kg/mol, with a molecular weight ratio (PS:PMMA) of approximately 66:34, the degree of polymerization N is about 622.9, so $\chi N$ is approximately 22.5 at 200° C.

In this manner, by adjusting one or more parameters such as the composition, the total molecular weight, and the annealing temperature, the mutual compulsion between the different polymeric block components in the block copolymer of the present invention can be readily controlled to effectuate desired phase separation between the different block components. The phase separation in turn leads to formation of self-assembled periodic patterns containing ordered arrays of repeating structural units (i.e., spheres, cylinders, or lamellae), as described hereinabove.

In order to form the self-assembled periodic patterns, the block copolymer is first dissolved in a suitable solvent system to form a block copolymer solution, which is then applied onto a surface to form a thin block copolymer layer, followed by annealing of the thin block copolymer layer, thereby effectuating phase separation between different polymeric block components contained in the block copolymer.

The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone. The block copolymer solution preferably contains the block copolymer at a concentration ranging from about 0.1% to about 2% by total weight of the solution. More preferably, the block copolymer solution contains the block copolymer at a concentration ranging from about 0.5 wt % to about 1.5 wt %.

The block copolymer solution can be applied to the surface of a structure by any suitable techniques, including, but not limited to: spin casting, coating, spraying, ink coating, dip coating, etc. Preferably, the block copolymer solution is spin cast onto the surface of a structure to form a thin block copolymer layer thereon.

After application of the thin block copolymer layer onto the interconnect surface such as is shown, for example, in FIG. 2A-2B, the entire structure is annealed to effectuate micro-phase segregation of the different block components contained by the block copolymer, thereby forming the periodic patterns with repeating structural units. FIGS. 3A-3B shows the structure after annealing. Annealing of the block copolymer in the present invention can be achieved by various methods known in the art, including, but not limited to: thermal annealing (either in a vacuum or in an inert atmosphere containing nitrogen or argon), ultra-violet annealing, laser annealing, solvent vapor-assisted annealing (either at or above room temperature), and supercritical fluid-assisted annealing, which are not described in detail here in order to avoid obscuring the invention.

In a particularly preferred embodiment of the present invention, a thermal annealing step is carried out to anneal the block copolymer layer at an elevated annealing temperature that is above the glass transition temperature ($T_g$) of the block copolymer, but below the decomposition or degradation temperature ($T_d$) of the block copolymer. More preferably, the thermal annealing step is carried out an annealing temperature of about 200° C.-300° C. The thermal annealing may last from less than about 1 hour to about 100 hours, and more typically from about 1 hour to about 15 hours. In an alternative embodiment of the present invention, the block copolymer layer is annealed by ultra-violet (UV) treatment.

It is noted that the annealed block copolymer 20' can comprise a first polymeric component A and a second polymeric component B, in which the pattern is an ordered array of cylinders composed of the block component B in a polymeric matrix composed of the polymeric block component A. Such an annealed block copolymer in which the ordered array of cylinders is aligned vertical with a surface of the sacrificial layer 14 is shown in FIGS. 3A-3B. It is noted in the embodiment illustrated the B blocks can be used to provide sub-lithographic openings having a width from about 10 to about 40 nm into the sacrificial layer 14. This is achieved by having the cylindrical shaped block aligned vertical to the surface of the sacrificial layer 14. The particular alignment of the cylindrical block is determined by the surface wetting conditions as are described in greater detail below.

The present invention employs lithographic features to limit formation and placement of the structural units formed by the self-assembling block copolymer materials. More specifically, the lithographic features as used by the present invention have dimensions that are adjusted so that only a single unit polymer block can be formed and placed inside each lithographic feature from the self-assembling block copolymer.

Optionally, but not necessarily, the interior surfaces of the lithographically defined mask opening 18 are treated before application of a block copolymer layer. Specifically, one or more surface layers are formed over the bottom surface and sidewall surfaces of the lithographically defined mask opening 18, so as to provide the desired wetting properties for aligning the alternating layers of unit polymeric blocks to be formed with the lithographically defined mask opening 18.

The wetting properties as discussed herein refer to the surface affinities of a specific surface with respect to the different block components of the block copolymers. For example, if a surface has substantially the same surface affinity to both block components A and B of a block copolymer, such a surface is considered a neutral surface or a non-preferential surface, i.e., both block components A and B can wet or have affinities to such a surface. In contrast, if a surface has significantly different surface affinities for the block components A and B, such a surface is then considered a preferential surface, i.e., only one of block components A and B can wet such a surface, but the other cannot.

Surfaces comprising one of silicon native oxides, silicon oxides, and silicon nitrides are preferentially wetted by PMMA block components, but not by PS block components. Therefore, such surfaces can be used as preferential surfaces for PS-b-PMMA block copolymers. On the other hand, a monolayer comprising a substantially homogenous mixture of PS and PMMA components, such as a random PS-r-PMMA copolymer layer, provides a neutral surface or a non-preferential surface for PS-b-PMMA block copolymers.

In order to form alternating layers of polymeric blocks that are aligned perpendicular to the bottom surface of the lithographically defined mask opening 18 from PS-b-PMMA, it is desired to deposit a neutral or non-preferential monolayer (e.g., a substantially homogenous mixture of PS and PMMA components) over the bottom surface of the lithographically defined mask opening 18, while the sidewall surfaces of the lithographically defined mask opening 18 are either left untreated or are coated with a preferential wetting material (e.g., silicon native oxides, silicon oxides, and silicon nitrides). In this manner, the alternating layers of polymeric blocks formed from PS-b-PMMA will stand perpendicular to the bottom surface of the lithographic mask opening 18.

Figure 4A:
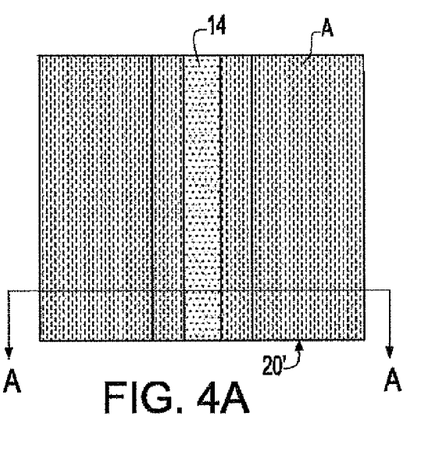
FIGS. 4A-4B are pictorial representations (through a top-down and a cross sectional view) of the structure of FIGS. 3A-3B after selectively removing one of the polymeric components of the self-assembling copolymer forming at least one sub-lithographic opening in said copolymer.
Figure 4B:
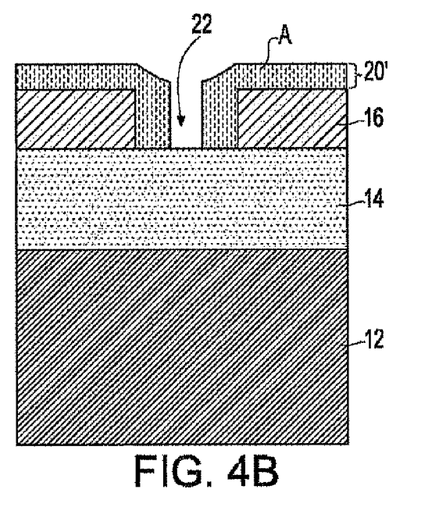

FIGS. 4A-4B show the structure after etching the second polymeric block copolymer component B therefrom. As shown, the resultant structure now includes a sub-lithographic opening 22 having a width that is less than 60 nm, preferably less than about 50 nm, in the annealed block copolymer 20'. The sub-lithographic opening 22 is formed by selectively etching (via a dry etching or wetting etching process) the second polymeric block copolymer component B relative to the first polymeric block copolymer component A.

Figure 5A:
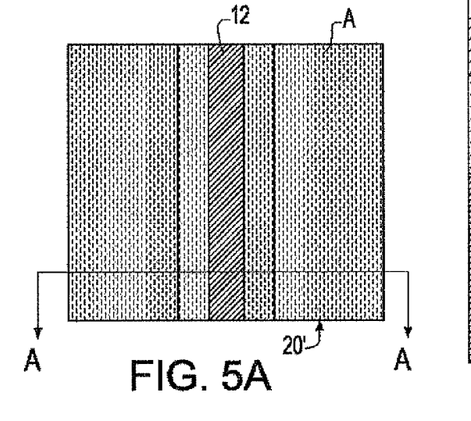
FIGS. 5A-5B are pictorial representations (through a top-down and a cross sectional view) of the structure of FIGS. 4A-4B after extending the sub-lithographic opening through the sacrificial layer.
Figure 5B:
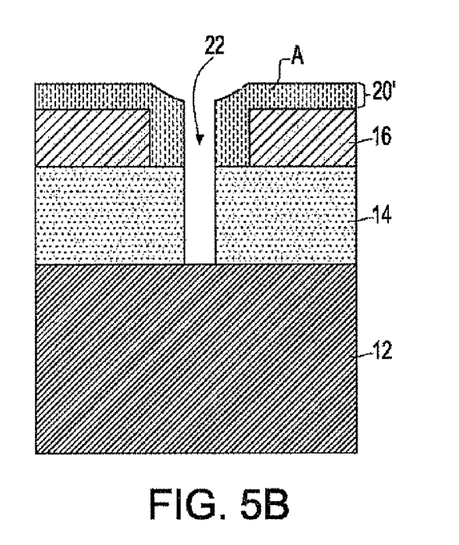

FIGS. 5A-5B show the structure after extending the sub-lithographic opening 22 through portions of the underlying sacrificial layer 14, stopping atop the upper surface of substrate 12. The extending of the sub-lithographic opening 22 is performed utilizing an etching process such as, for example, reactive-ion etching.

Figure 6A:
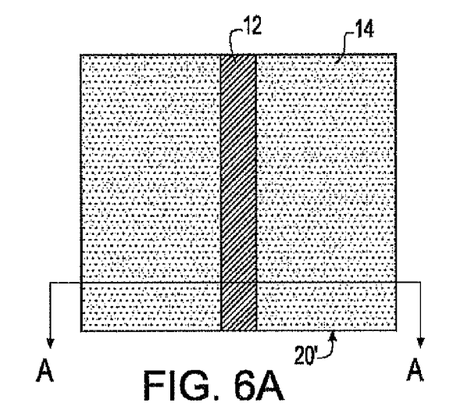
FIGS. 6A-6B are pictorial representations (through a top-down and a cross sectional view) of the structure of FIGS. 6A-6B after stripping the copolymer and the patterned hard mask.
Figure 6B:
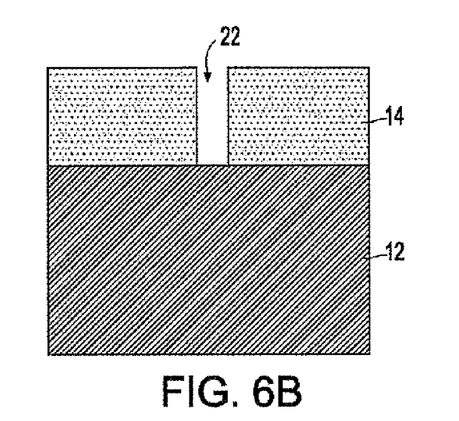
Figure 7A:
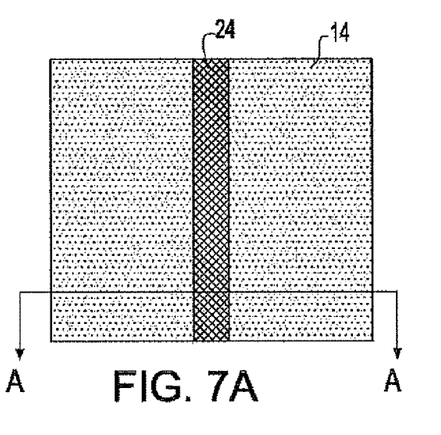
FIGS. 7A-7B are pictorial representations (through a top-down and a cross sectional view) of the structure of FIGS. 6A-6B after forming a gate dielectric on an exposed surface of the semiconductor substrate through the extended sub-lithographic opening.
Figure 7B:
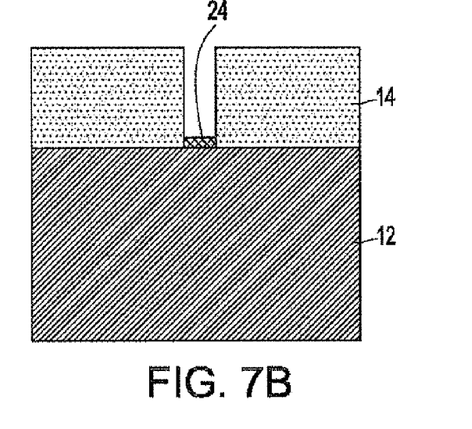

FIGS. 6A-6B show the structure that is formed after removing the remaining block copolymer and patterned hard mask 16 from the structure. The remaining block copolymer may be removed utilizing a conventional stripping process well known to those skilled in the art. The patterned hard mask 16 may be removed by a conventional planarization process such as, for example, chemical mechanical polishing (CMP) and/or grinding. The planarization process stops on an upper surface of the underlying sacrificial layer 14 which includes the sub-lithographic opening 22 therein FIG. 7A-7B illustrate the structure after forming a gate dielectric 24 on the exposed surface of the semiconductor substrate 12 through the sub-lithographic opening 22. Prior to formation of the gate dielectric 24, an ion implantation step may be performed to dope the channel region n-type or p-type. Where appropriate, block masks can be used to prevent unwanted doping in exposed portions of the semiconductor substrate 12. Such an embodiment can be used when nFETs and pFETs are formed.

The gate dielectric 24 comprises any suitable dielectric material including, but not limited to oxides, nitrides, oxynitrides, silicates (e.g., metal silicates and nitrided metal silicates) and multilayers thereof. In one embodiment, it is preferred that the gate dielectric 24 comprise an oxide such as, for example, $SiO_2$, $HfO_2$, $ZrO_2$, $Al_2O_3$, $TiO_2$, $La_2O_3$, $SrTiO_3$, $LaAlO_3$ and multilayers thereof. The physical thickness of the gate dielectric 24 may vary depending on the specific technique used in forming the same. Typically, the gate dielectric 24 has a thickness from about 0.5 to about 10 nm, with a thickness from about 1 to about 7 nm being even more typical.

The gate dielectric 24 may be formed by a conventional deposition process such as, for example, CVD, PECVD, ALD, evaporation, reactive sputtering and chemical solution deposition. A thermal process such as an oxidation, nitrification or oxynitridation may also be employed. The gate dielectric 24 may also be formed utilizing a combination of the above-mentioned techniques.

Figure 8A:
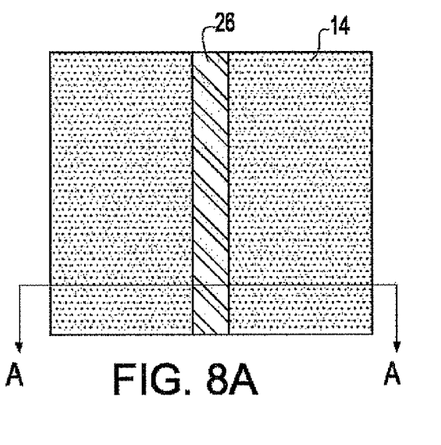
FIGS. 8A-8B are pictorial representations (through a top-down and a cross sectional view) of the structure of FIGS. 7A-7B after forming a gate conductor on the gate dielectric through the extended sub-lithographic opening.
Figure 8B:
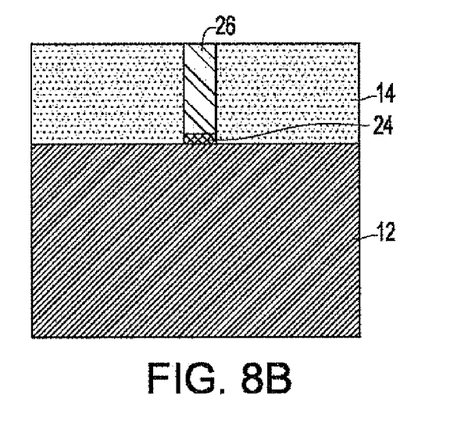

FIGS. 8A-8B shows the structure after filling the remaining portions of the sub-lithographic opening 22 with a gate conductor 26 and planarization. The gate conductor 26 may comprise any suitable conductive material including, but not limited to: doped polySi, doped SiGe, elemental metals, alloys of elemental metals, metal silicides and multilayers thereof. The gate conductor 26 is formed utilizing conventional techniques well known to those skilled in the art. After deposition of the conductive material, a conventional planarization process such as CMP and/or grinding is used.

Figure 9A:
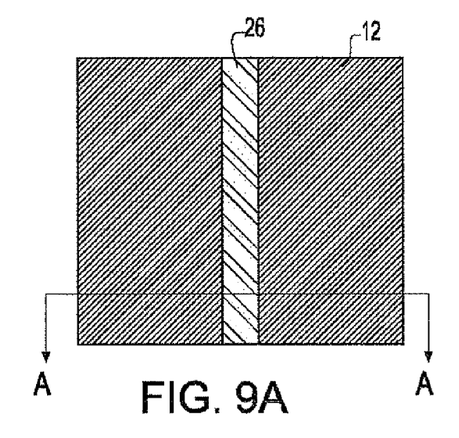
FIGS. 9A-9B are pictorial representations (through a top-down and a cross sectional view) of the structure of FIGS. 8A-8B after removing the sacrificial layer from the structure.
Figure 9B:
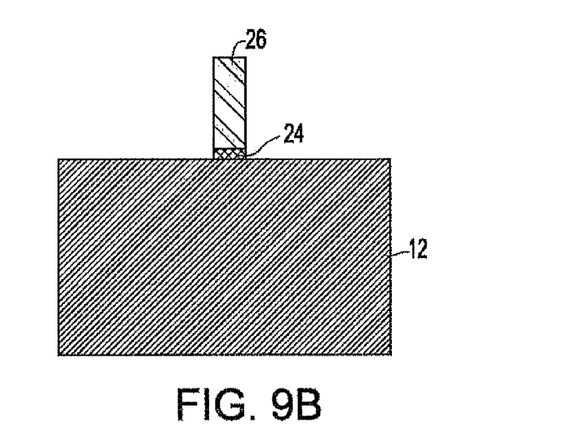

FIGS. 9A-9B show the resultant structure that is formed after removing the sacrificial layer 14 therefrom. Any conventional etch back process that selectively removes the sacrificial layer 14 can be used in the present invention.

Figure 10A:
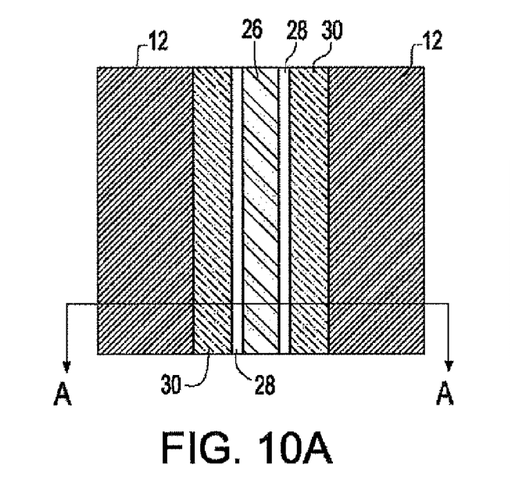
FIGS. 10A-10B are pictorial representations (through a top-down and a cross sectional view) of the structure of FIGS. 9A-9B after forming at least one spacer on the sidewalls of the gate conductor/gate dielectric stack.
Figure 10B:
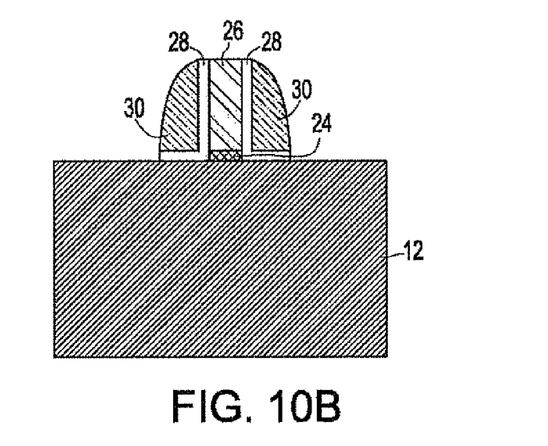

FIG. 10A-10B shows the structure after formation of at least one spacer on sidewalls of the gate conductor/gate dielectric stack. The at least one spacer may include a single spacer or a pair of spacers, as is shown in FIGS. 10A-10B. The pair of spacers includes an inner spacer 28 and an outer spacer 30. The spacers are formed utilizing conventional processing well known to those skilled in the art. Extension implants are typically performed after formation of the inner spacer, and source/drain diffusion regions are formed after outer spacer formation. The implants used in forming the extension region (not specifically shown) and the source/drain diffusions (not specifically show) are carried out be conventional ion implantation. An activation anneal is used to active the implanted dopant regions.

At this point of the present invention further CMOS and/or interconnect processing may be performed. For example, a stress liner may be formed to stress the channel region, and silicide contacts may be formed atop the source/drain diffusions and optionally, the gate conductor (if composed of polySi or SiGe).

Because of the method of the present invention, the final feature of the transistor including the channel length is than 60 nm. It is noted that the processing steps mentioned above can be used to form a plurality of sub-lithographic gate transistors which may or may not be of the same conductive type.

It is also noted that the line edge roughness of the transistor formed by the inventive method is smoother than that obtained by conventional techniques.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
   at least one transistor located on a surface of a semiconductor substrate, said at least one transistor having a gate length of less than 60 nm and a line edge roughness in terms of 3-sigma of less than 6 nm.

2. The semiconductor structure of claim 1 wherein said semiconductor substrate comprises a bulk semiconductor, a hybrid oriented semiconductor, or a semiconductor-on-insulator.

3. The semiconductor structure of claim 1 wherein said at least one transistor includes a gate dielectric composed of an oxide.

4. The semiconductor structure of claim 1 wherein said at least one transistor is a pFET, an nFET or a combination of at least one nFET and at least one pFET.

5. The semiconductor structure of claim 1 wherein said at least one transistor includes a gate conductor comprised of doped polySi, doped SiGe, an elemental metal, an alloy of an elemental metal, a metal silicide or multilayers thereof.

6. The semiconductor structure of claim 1 further comprising at least one spacer located on sidewalls of said at least one transistor.

7. The semiconductor structure of claim 6 wherein said at least one spacer comprises an inner spacer and an adjoining outer spacer.

8. A semiconductor structure comprising:
   at least one p-type field effect transistor and at least one n-type field effect transistor located on a surface of a semiconductor substrate, wherein both transistors have a channel length that is less than 60 nm and a line edge roughness in terms of 3-sigma of less than 6 nm.

9. The semiconductor structure of claim 8 wherein said semiconductor substrate comprises a bulk semiconductor, a hybrid oriented semiconductor, or a semiconductor-on-insulator.

10. The semiconductor structure of claim 8 wherein said transistors each include a gate dielectric composed of an oxide.

11. The semiconductor structure of claim 8 wherein said transistors each include a gate conductor comprised of doped polySi, doped SiGe, an elemental metal, an alloy of an elemental metal, a metal silicide or multilayers thereof.

12. The semiconductor structure of claim 8 further comprising at least one spacer located on sidewalls of each of said transistors.

* * * * *